United States Patent
Min et al.

(10) Patent No.: US 6,380,001 B1
(45) Date of Patent: Apr. 30, 2002

(54) FLEXIBLE PIN COUNT PACKAGE FOR SEMICONDUCTOR DEVICE

(75) Inventors: Byoung-Youl Min, Cupertino; Thomas J. Massingill, Scotts Valley, both of CA (US)

(73) Assignee: VLSI Technology, Inc., San Jose, CA (US)

( * ) Notice: Subject to any disclaimer, the term of this patent is extended or adjusted under 35 U.S.C. 154(b) by 0 days.

(21) Appl. No.: 09/439,564

(22) Filed: Nov. 12, 1999

Related U.S. Application Data

(62) Division of application No. 09/015,420, filed on Jan. 29, 1998.

(51) Int. Cl.[7] .......................... H01L 21/44; H01L 21/48; H01L 21/50
(52) U.S. Cl. .......................... 438/118; 438/126; 438/127
(58) Field of Search ................................. 438/111, 112, 438/118, 126, 127; 257/688, 690, 696, 701, 792

(56) References Cited

U.S. PATENT DOCUMENTS

| | | | | |
|---|---|---|---|---|
| 5,334,874 A | * | 8/1994 | Metzler et al. | 257/678 |
| 5,592,025 A | * | 1/1997 | Clark et al. | 257/774 |
| 5,648,679 A | * | 7/1997 | Chillara et al. | 257/666 |
| 5,841,192 A | * | 11/1998 | Exposito | 257/701 |
| 5,859,475 A | * | 1/1999 | Freyman et al. | 257/738 |
| 5,889,333 A | * | 3/1999 | Takenaka et al. | 257/783 |
| 5,895,965 A | * | 4/1999 | Tanaka et al. | 257/668 |
| 5,926,696 A | * | 7/1999 | Baxter et al. | 438/118 |
| 5,930,603 A | * | 7/1999 | Tsuji et al. | 438/127 |
| 5,956,232 A | * | 9/1999 | Zakel et al. | 361/760 |
| 5,973,337 A | * | 10/1999 | Knapp et al. | 257/99 |
| 5,985,695 A | * | 11/1999 | Freyman et al. | 438/112 |
| 6,084,295 A | * | 7/2000 | Horiuchi et al. | 257/690 |

* cited by examiner

*Primary Examiner*—Wael Faburyl
*Assistant Examiner*—Fernando Toledo
(74) *Attorney, Agent, or Firm*—Wagner Murabito & Hao LLP

(57) ABSTRACT

A package for a semiconductor device and a method for packaging a semiconductor device are disclosed. The semiconductor package uses a tape which allows for the production of packaged semiconductor devices having different contact patterns. The contact pattern is configured to the required pin contact pattern by varying the number and placement of balls on the bottom of the tape. In one embodiment, the tape includes bonding pads and an array of contact pads. Each bonding pad is connected to one of the contact pads, and an opening is disposed in the tape below each contact pad. A semiconductor device is connected to the tape and is electrically connected to the bonding pads. The semiconductor device is then sealed on the top and sides by a plastic top which attaches to the tape. Balls are then selectively attached to the tape such that they electrically connect to select contact pads so as to form a desired contact pattern. Packages having different contact patterns are easily formed by altering the number and position of balls deposited on the tape. Thus, a single tape may be used for forming packaged semiconductor devices having different contact patterns. Thus, significant cost savings is realized since different tapes need not be fabricated for each different contact pattern.

6 Claims, 10 Drawing Sheets

FLEXIBLE PIN COUNT PACKAGE FOR SEMICONDUCTOR DEVICE

This is a divisional of copending application Ser. No. 09/015,420 filed on Jan. 29, 1998.

TECHNICAL FIELD

This invention relates to the field of semiconductor devices. More particularly, the present invention relates to an improved package for a semiconductor device and an improved method for packaging semiconductor devices.

BACKGROUND ART

Prior art methods for packaging semiconductor devices typically require that a semiconductor device be electrically connected to a printed circuit board. A wire bonding or tape automated bonding process is typically used to connect bonding pads located on the semiconductor device to the bonding pads on the printed circuit board. The printed circuit board and the semiconductor device are then encapsulated to form a packaged semiconductor device.

Recently, packaging techniques which use tape instead of a printed circuit board have been developed for packaging semiconductor devices. The use of tape instead of a printed circuit board gives higher interconnection capability. A typical prior art tape includes a polyimide layer over which a conductive layer is formed. The conductive layer is patterned so as to form bonding pads, an array of contact pads, and interconnects which connect each bonding pad to a contact pad. In one recent design, an opening in the polyimide tape is disposed below each contact pad.

In a typical prior art semiconductor device packaging process that uses tape, a semiconductor device (commonly referred to as a die) is placed over the tape such that the semiconductor device overlies the conductive layer of the tape. Each of the bonding pads is electrically connected to a corresponding bonding pad on the semiconductor device. The wire bonding or tape automated bonding process couples one of the bonding pads on the semiconductor device to one of the bonding pads on the tape.

After the bonding pads are coupled, the resulting assembly is then encapsulated. This encapsulation process typically involves coating or encapsulation of organic material over the semiconductor device. A transfer of molding or glob top coating process is typically used. Next, balls are formed over each of the openings in the polyimide tape such that each of the balls is in electrical contact with one of the contact pads. Since each contact pad is electrically coupled to one of the bonding pads on the semiconductor device, each of the balls are electrically coupled to the semiconductor device.

Each of the balls performs the same function as one of the pins used in a prior art process that uses a printed circuit board. That is, each ball provides connectivity to other devices in the same manner as would a pin. Thus, the balls form a pattern of electrical contacts (hereinafter referred to as a contact pattern) that is required for a particular package. Thus, the contact pattern is the equivalent of a given configuration of pins in a prior art device that uses pins with balls functioning as contacts in place of pins.

This process is repeated for each different semiconductor device to be packaged. That is, a tape having an array of contact pads and bonding pads that meets the specific requirements for each different packaging specification is used to package a particular semiconductor device. For example, a particular semiconductor device may require a contact pattern that has 144 contacts. A tape having 144 bonding pads and 144 contact pads would then be used. The tape would be connected to the semiconductor device and packaged as discussed above, resulting in 144 balls extending from the bottom of the semiconductor package.

In the event that a semiconductor packaging specification called for a contact pattern having 196 contacts, a tape having 196 bonding pads and 196 contact pads would be used to form a packaged semiconductor. The resulting packed semiconductor device would have 196 balls extending from the bottom of the semiconductor package. Some of the more common contact patterns have 128 contacts, 132 contacts, 144 contacts, 180, 196, 208, 256, and 280 contacts.

One of the most significant costs in packaging semiconductor devices using the above-discussed packaging process is the cost of the tape itself. Since different products require different contact patterns, a different configuration of tape must be manufactured for each different product. This is quite expensive since the manufacture and/or purchase of small quantities of tape is quite expensive. Only by purchasing large lots of a particular configuration of tape are the exceedingly high costs of tape reduced. In addition, since many different configurations of tape must be kept in stock, inventory maintenance is quite expensive.

What is needed is a way to more efficiently package semiconductor devices having different packaging requirements. In addition, a method for packaging semiconductor devices which is cost effective, efficient, and which allows for current mass-production packaging methods to be used is required. More particularly, a way to more efficiently package semiconductor devices which will reduce the cost associated with tape is required. The present invention meets the above needs.

DISCLOSURE OF THE INVENTION

The present invention includes a package for a semiconductor device and a method for packaging a semiconductor device which allows for packaging semiconductor devices into packages having different contact pattern requirements using common configurations of tape.

A flexible package for a semiconductor device and a method for packaging a semiconductor device is disclosed. The package includes a tape and an encapsulated organic material. The tape includes a layer of polyimide film over which a conductive layer is deposited. The conductive layer is patterned so as to form an array of contact pads, bonding pads, and interconnects. The interconnects electrically couple each bonding pad to one of the contact pads. Openings are formed in the tape which correspond to each contact pad such that a portion of the bottom surface of each of the contact pads is exposed through a corresponding opening. The number of contact pads and bonding pads on the tape is optimized such that multiple contact patterns may be produced using a common tape configuration.

In operation, a semiconductor device is packaged by placing the semiconductor device onto the tape. The semiconductor device is then electrically coupled to the tape. In one embodiment of the present invention, a tape automated bonding or wire bonding process is used to connect bonding pads of the semiconductor device to bonding pads on the tape using leads. The semiconductor device is then sealed on the top and sides by disposing a plastic top thereover and sealing the plastic top to the tape.

Next, balls are selectively deposited over the bottom surface of the contact pads to make a desired contact pattern.

In one embodiment, the contact pads which are not to have balls deposited thereover are sealed using a sealant. Then, solder is applied to the bottom of the tape such that balls are formed over the contact pads which were not sealed. Alternatively, a solder bumping process is used for forming balls (solder bumps) over designated contact pads.

The present invention allows for the mass production of tape since a single configuration of tape may be used to form multiple contact patterns. That is, a tape having a given number of contact pads and bonding pads may be used to make a packaged semiconductor device having a number of contacts which is the same as the number of contact pads and may also be used to make a packaged semiconductor device having a lesser number of contacts and/or a different placement of contacts.

The packaging method of the present invention allows for more efficient packaging of semiconductor devices having different packaging requirements. In addition, the method for packaging semiconductor devices of the present invention is cost effective since there is no need to manufacture different tapes for each contact pattern. Moreover, since there is no need for a special configuration of tape for each contact pattern, inventory requirements and inventory holding costs are reduced.

These and other objects and advantages of the present invention will no doubt become obvious to those of ordinary skill in the art after having read the following detailed description of the preferred embodiments which are illustrated in the various drawing figures.

BRIEF DESCRIPTION OF THE DRAWINGS

The accompanying drawings, which are incorporated in and form a part of this specification, illustrate embodiments of the invention and, together with the description, serve to explain the principles of the invention.

BEST MODE FOR CARRYING OUT THE INVENTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

Figure 1:
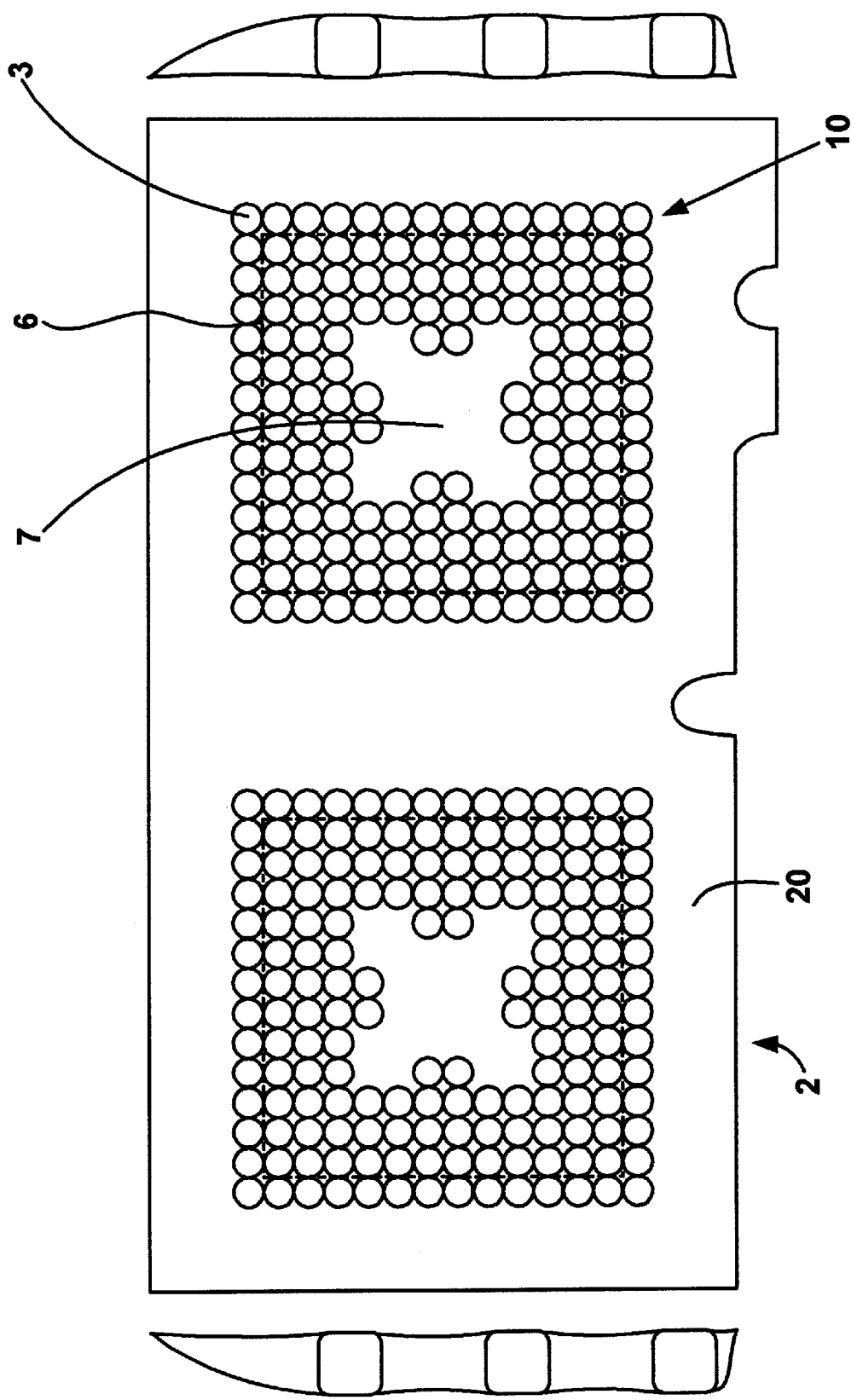
FIG. 1 shows a top view of a tape that includes an array of contact pads and bonding pads which are connected using interconnects in accordance with the present invention.

FIG. 1 shows a tape 2 which includes a layer of conductive material patterned so as to form a conductive array 10, bonding pads 6, and interconnects 7. In one embodiment, tape 2 is formed by depositing or laminating a layer of metal over a dielectric layer 20. In one embodiment, dielectric layer 20 is a layer of polyimide. Conductive array 10 includes contact pads 3 which are disposed in horizontal and vertical rows. Each of contact pads 3 is connected to one of bonding pads 6 by an interconnect 7.

Figure 2:
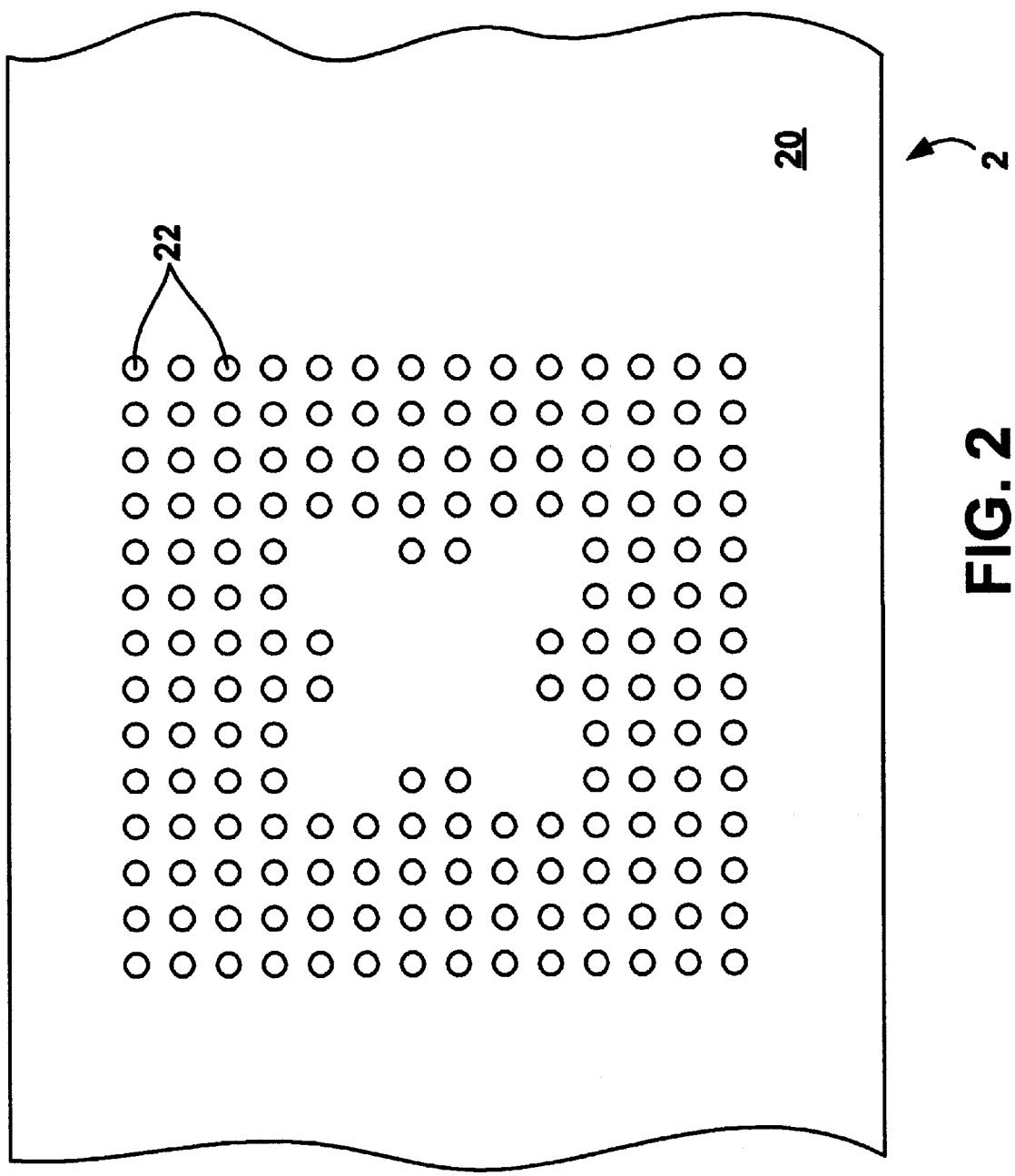
FIG. 2 is a bottom view of a tape which shows openings formed in the tape in accordance with the present invention.

With reference now to FIG. 2, which shows a bottom view of tape 2, it can be seen that openings 22 are formed in dielectric layer 20 which correspond to the position of each of contact pads 3 of FIG. 1. Thus, a portion of the bottom surface of each of contact pads 3 of FIG. 1 is exposed through dielectric layer 20 via one of openings 22 of FIG. 2.

Figure 3:
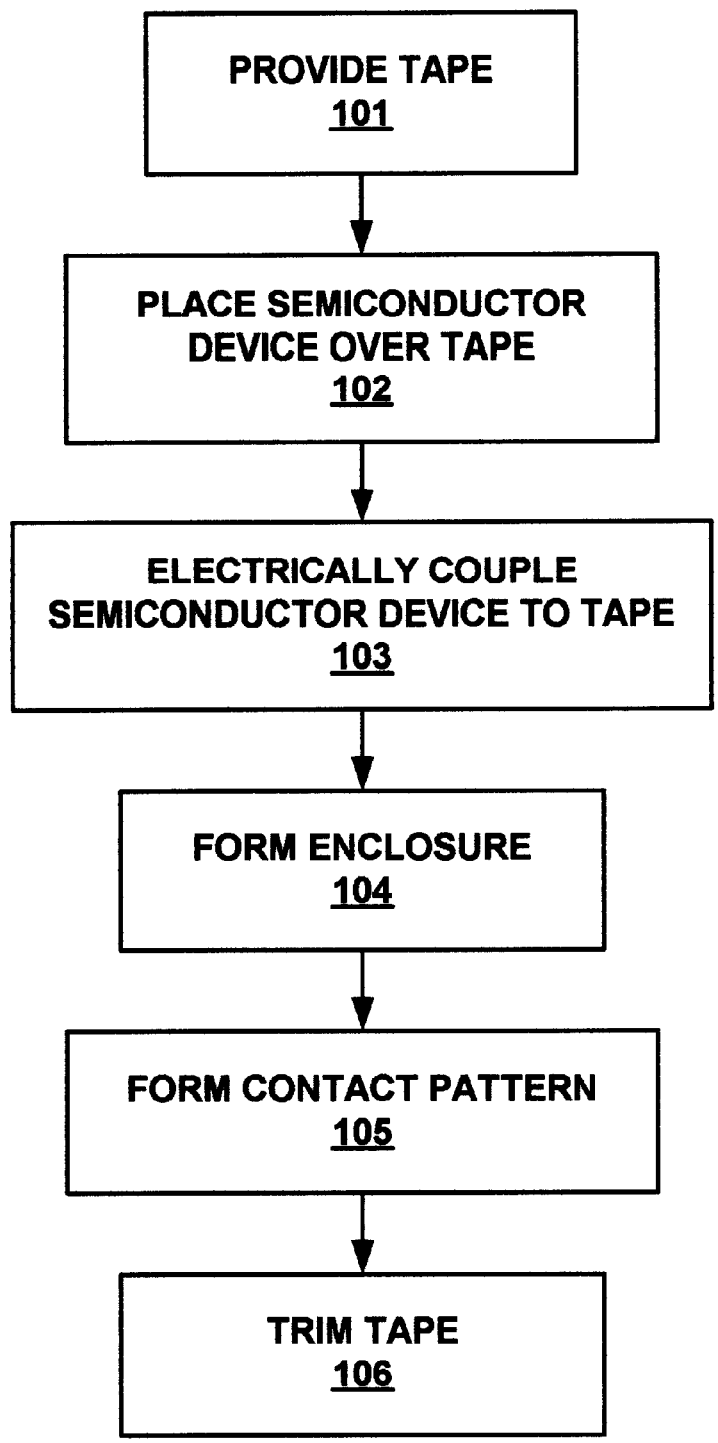
FIG. 3 is a diagram showing the steps for packaging a semiconductor device in accordance with one embodiment of the present invention.

FIG. 3 shows the steps for forming a packaged semiconductor according to the present invention. First, a tape is provided as shown by step 101. In one embodiment of the present invention the tape includes an array of contact pads which are electrically connected to bonding pads. Next, a semiconductor device is placed over the tape as shown by step 102. The semiconductor device is placed over the tape such that it overlies a conductive array such as conductive array 10 of FIG. 1. In one embodiment, the semiconductor device is secured to the tape using an epoxy adhesive. Next, the semiconductor device is electrically coupled to the tape as shown by step 103. In one embodiment of the present invention, the semiconductor device is electrically coupled to the tape using a tape automated bonding process.

Figure 4:
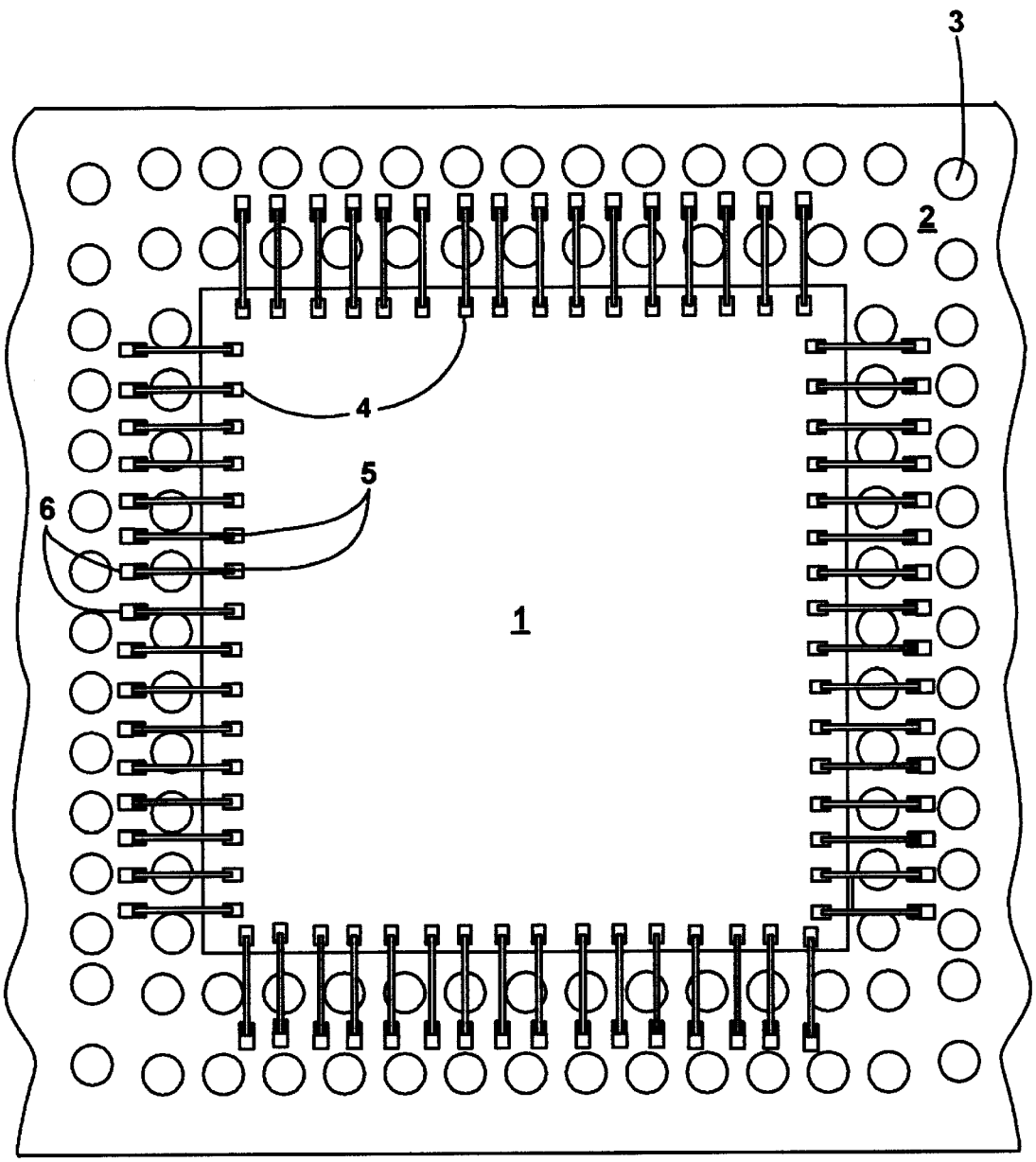
FIG. 4 shows a top view of a semiconductor device which is electrically coupled to a tape in accordance with the present invention.

FIG. 4 shows a semiconductor device 1 which has been electrically coupled to tape 2. More specifically, bonding pads 4 of semiconductor device 1 have been coupled to bonding pads 6 of tape 2 using leads 5. This electrically couples semiconductor device 1 to bonding pads 6. As previously discussed, each of bonding pads 6 is coupled to one of contact pads 3 via an interconnect 7 (not shown). This results in an electrical coupling between each of bonding pads 4 on semiconductor device 1 and one of contact pads 3.

With reference back to FIG. 3, an enclosure is then formed around the semiconductor device as shown by step 104. In one embodiment the enclosure is formed by placing a plastic top over the tape and sealing the plastic top to the tape. In one embodiment, the seal is formed by heating the plastic top and pressing the plastic top against the tape such that a bond is formed between the plastic top and the tape, thereby forming an enclosure. Alternatively, any of a number of different methods for sealing a semiconductor package may be used such as, for example, using a glob top, etc.

Figure 5:
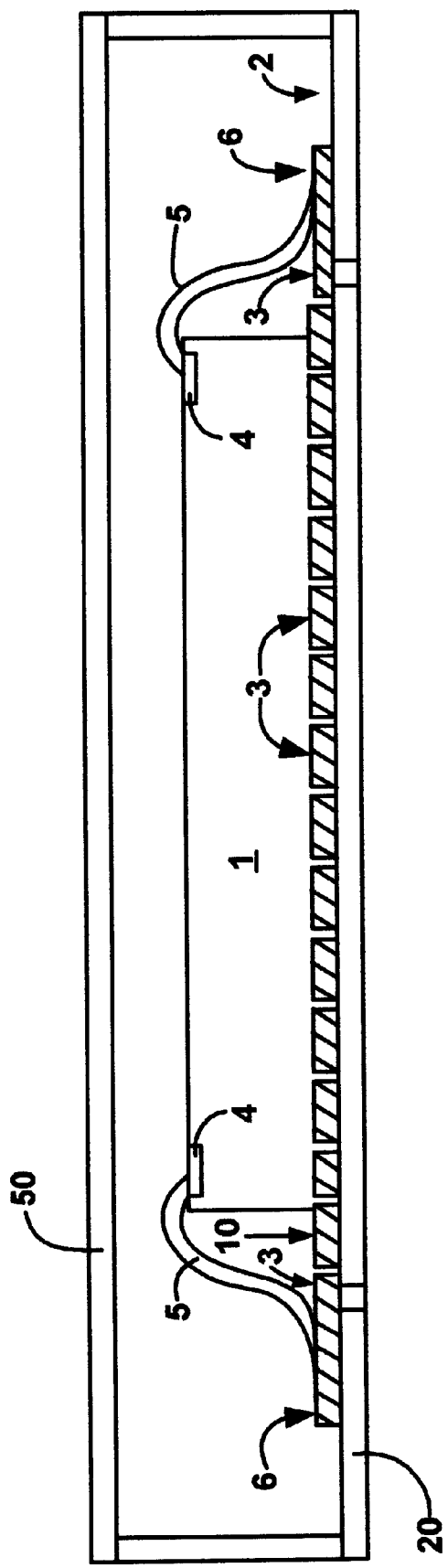
FIG. 5 is cross sectional view of a semiconductor device which is coupled to a tape in accordance with the present invention.

FIG. 5 shows an enclosure formed using plastic top 50. That is, the top and the sides of the enclosure are formed by plastic top 50 and the bottom of the enclosure is formed by tape 2. Plastic top 50 is shown to be sealed against tape 2.

With reference back to FIG. 3, the required contact pattern is then formed on the bottom of the tape as shown by step 105. In one embodiment of the present invention, the required contact pattern is formed by selectively depositing solder on the bottom of the tape so as to form contacts, as required, to make the designated pattern.

In one embodiment of the present invention, contacts are formed by balls, commonly referred to as solder bumps, which are formed over the bottom of the tape. In one embodiment, a conventional solder bumping process is used to selectively form balls over the tape so as to form the desired contact pattern.

Balls may be formed using any of a number of known processes. In one embodiment of the present invention, each of the openings that is not to be covered by a ball is covered by a layer of solder mask. The bottom of the tape is then immersed into solder such that solder is deposited into each opening which is not covered by solder mask, thereby forming balls under each contact pad which is not covered by solder mask. Alternatively, a thin layer of Pb/Sn may be used to seal each of the openings which are not to be covered by a ball.

Figure 6:
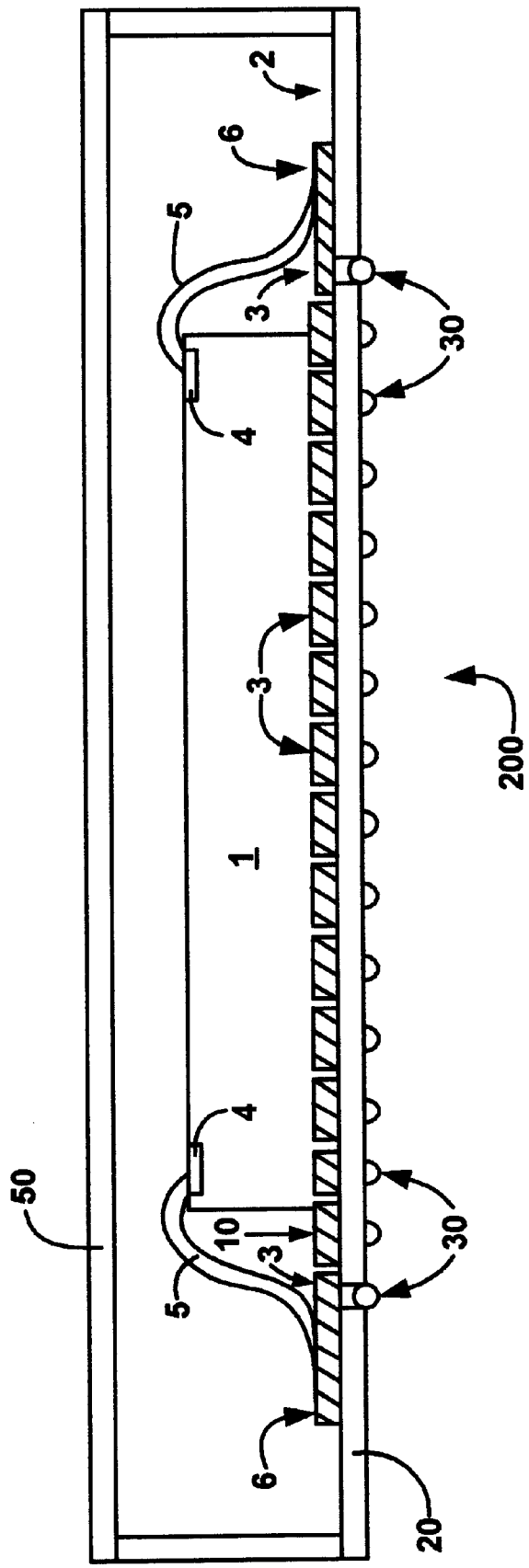
FIG. 6 is cross sectional view of a semiconductor device which is coupled to a tape and which has balls attached to contact pads so as to form a contact pattern in accordance with the present invention.
Figure 7:
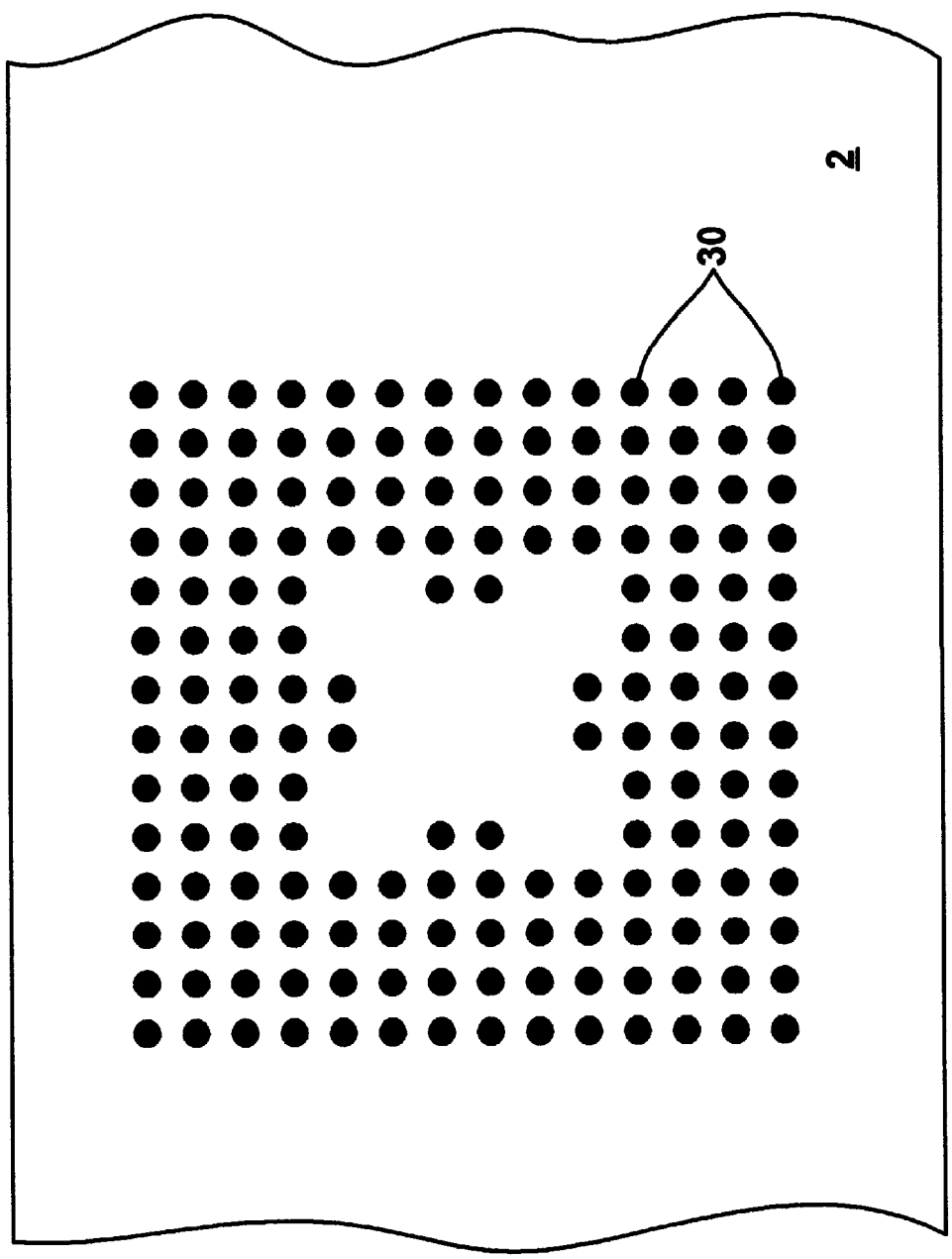
FIG. 7 is bottom view of a semiconductor device which is coupled to a tape and which has balls attached thereto so as to form a contact pattern in accordance with the present invention.

FIG. 6 shows a packaged semiconductor wafer 1 which is packaged so as to form contact pattern 200. Contact pattern 200 is formed by selectively depositing balls 30. Each of balls 30 is connected to one of contact pads 3 through one of openings 22 shown in FIG. 2. FIG. 7 shows contact pattern 200 to be a standard contact pattern having 168 contacts. In the present invention, each required contact in contact pattern 200 is made by one of balls 30.

Figure 8:
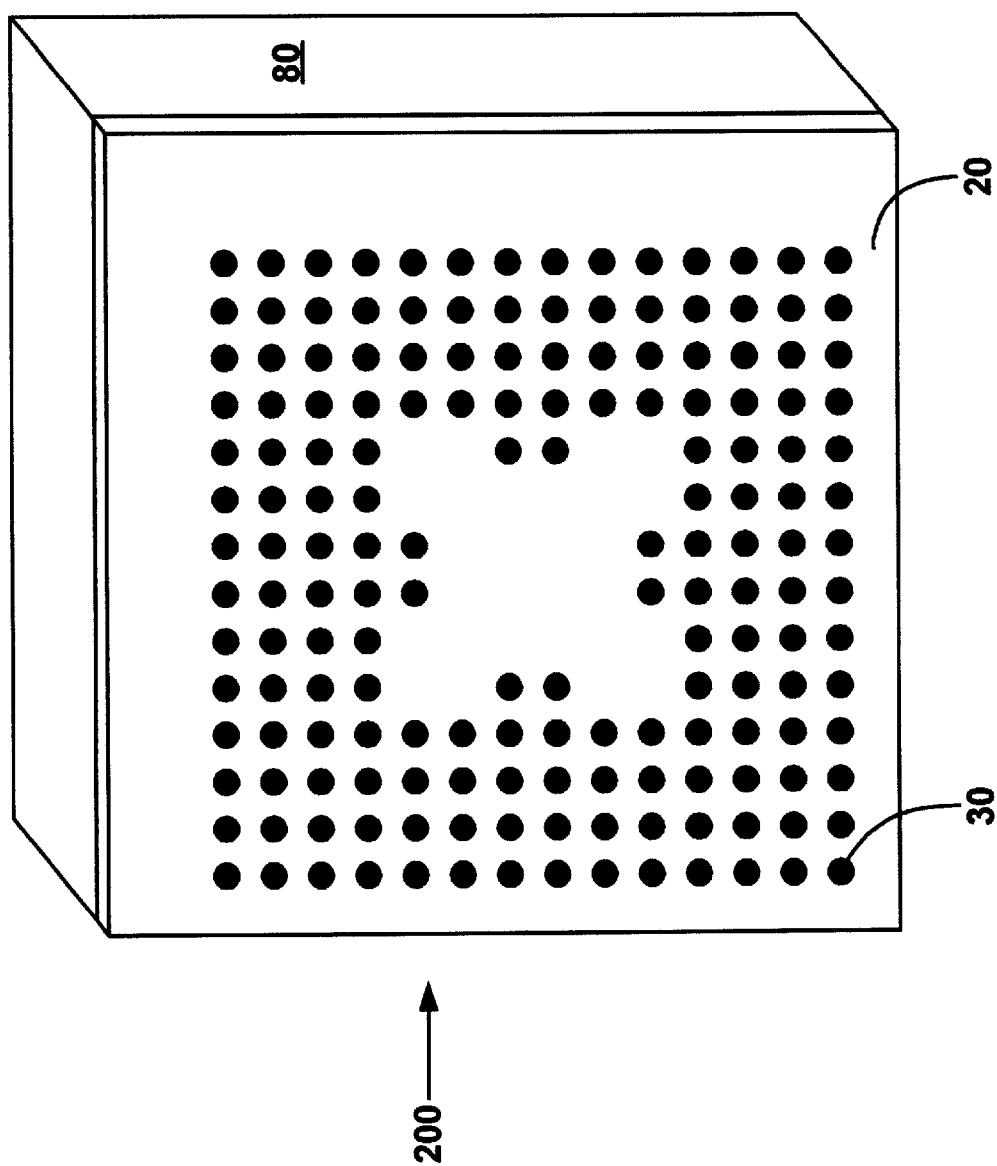
FIG. 8 is perspective view of a packaged semiconductor device that includes balls which form a contact pattern in accordance with the present invention.

With reference again back to FIG. 3, the tape is then trimmed as shown by step 106. FIG. 8 shows a packaged semiconductor device 80 resulting from the trimming of tape 2 of FIG. 7.

Figure 9:
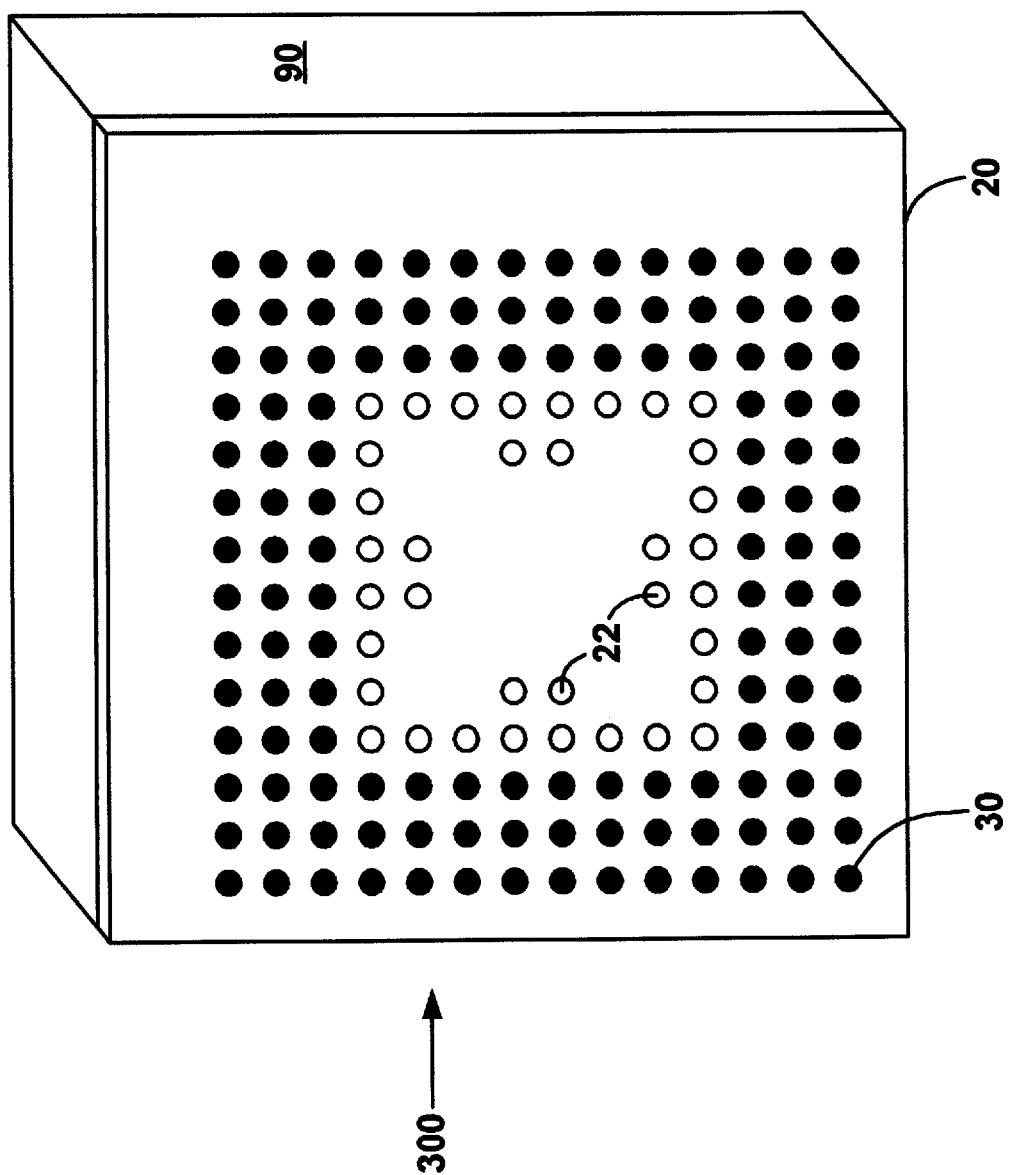
FIG. 9 is perspective view of a packaged semiconductor device that includes balls which form a contact pattern that includes 132 contacts in accordance with the present invention.

Different contact patterns are formed by altering the pattern of balls 30. FIG. 9 shows a packaged semiconductor device 90 that is packaged 50 as to form contact pattern 300. In this embodiment, contact pattern 300 is a standard contact pattern having 132 contacts. In one embodiment, contact pattern 300 is produced by forming balls 30 over all of openings 22 of FIG. 2 except those openings 22 shown to remain open in FIG. 9. More particularly, balls are formed over the three uppermost rows and the three lowermost rows, and over the three columns that form the outermost rows on each side of conductive array 10 of FIG. 2.

Figure 10:
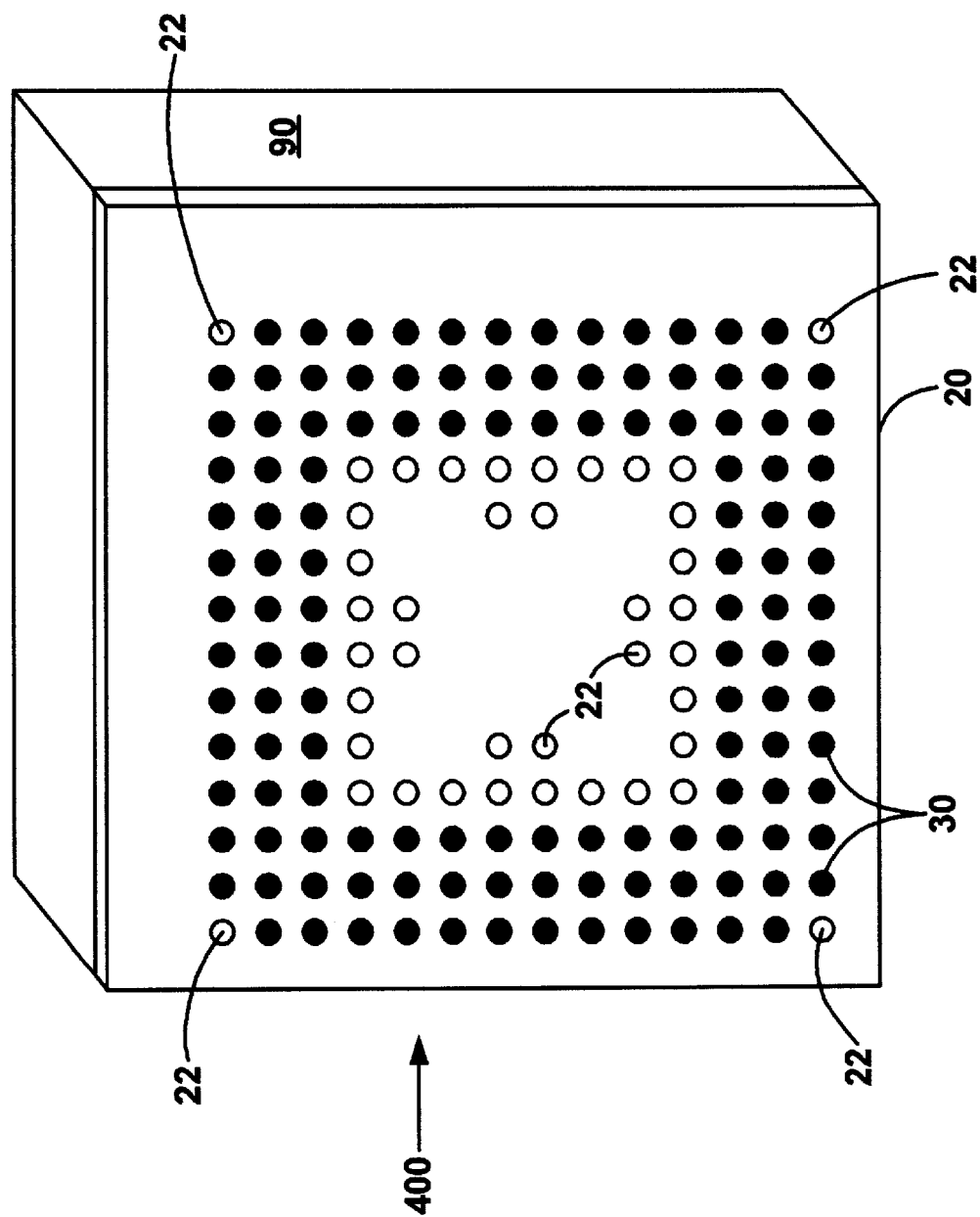
FIG. 10 is perspective view of a packaged semiconductor device that includes balls which form a contact pattern that includes 128 contacts in accordance with the present invention.

As discussed above, different contact patterns are formed by altering the pattern of balls 30. FIG. 10 shows a packaged semiconductor device 90 that is packaged so as to form contact pattern 400. In this embodiment, contact pattern 400 is a standard contact pattern having 128 contacts. In one embodiment, contact pattern 400 is produced by forming balls 30 over all of openings 22 of FIG. 2 except those openings 22 shown to remain open in FIG. 10. More particularly, balls are formed over the three uppermost rows and the three lowermost rows, and over the three columns that form the outermost rows on each side of conductive array 10 of FIG. 2 with the exception of openings 22 in each corner of conductive array 10.

Other configurations of contact patterns may be formed by using a tape having the required number of contact pads. For example, though tape 2 of FIGS. 1–10 is shown to have an array of 168 contact pads, an array having 196 contact pads may also be used. This would allow for the formation of packaged semiconductor devices having different contact patterns which contain 196 or fewer contacts.

Thus, the present invention provides for packaging semiconductor devices using a common configuration of tape so as to form packaged semiconductor devices having different contact patterns. This allows for the purchase and manufacture of large amounts of tape having the same configuration. This results in significant cost savings. In addition, since many different configurations of tape need not be purchased, inventory holding costs and manufacturing lead time is reduced.

In one embodiment, the configuration of tape to be used is determined using an optimization process. That is, tape configurations which are anticipated to minimize tape cost are determined using known orders for packaged products and using predictions of anticipated contact patterns to be produced.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order best to explain the principles of the invention and its practical application, to thereby enable others skilled in the art best to utilize the invention and various embodiments with various modifications as are suited to the particular use contemplated. It is intended that the scope of the invention be defined by the claims appended hereto and their equivalents.

What is claimed is:

1. A method for packaging a semiconductor device comprising:

providing a tape having a conductive array of contact pads that have a first contact pattern and a plurality of bonding pads disposed thereon, said conductive array of contact pads electrically connected to said plurality of bonding pads;

placing a semiconductor device over said tape;

electrically connecting said semiconductor device to said bonding pads;

forming an enclosure around said semiconductor device; and selectively attaching balls to ones of said contact pads so as to form a second contact pattern, said second contact pattern different from said first contact pattern as a result of configuration of said second contact pattern at a time subsequent from the time that said tape is formed such that the number of balls selectively attached to ones of said contact pads is less than the number of said contact pads.

2. The method for packaging a semiconductor device of claim 1 wherein said tape has a top side and a bottom side and includes a plurality of openings disposed therein, one of said openings disposed below each of said contact pads.

3. The method for packaging a semiconductor device of claim 2 wherein said step of selectively attaching balls includes the step of selectively attaching balls to the bottom side of said tape such that said balls are selectively attached to ones of said contact pads so as to form said second contact pattern.

4. The method for packaging a semiconductor device of claim 1 wherein said balls comprise solder.

5. A method for packaging a semiconductor device comprising:

provided a tape having a conductive array of contact pads that have a first contact pattern and a plurality of bonding pads disposed thereon, said conductive array of contact pads electrically connected to said plurality of bonding pads, and wherein said tape has a top side and a bottom side and includes a plurality of openings disposed therein, one of said openings disposed below each of said contact pads;

placing a semiconductor device over said tape;

electrically connecting said semiconductor device to said bonding pads;

forming an enclosure around said semiconductor device; and selectively attaching balls to ones of said contact pads so as to form a second contact pattern, said second contact pattern different from said first contact pattern as a result of configuration of said second contact pattern at a time subsequent from the time that said tape is formed such that the number of balls selectively attached to ones of said contact pads is less than the number of said contact pads, said balls selectively attached by sealing ones of said openings by depositing a layer of solder mask thereover and applying solder to said tape so as to selectively form balls over ones of said contact pads that do not have solder mask disposed thereover.

6. A method for packaging a semiconductor device comprising:

providing a tape having a conductive array of contact pads that have a first contact pattern and a plurality of bonding pads disposed thereon, said conductive array of contact pads electrically connected to said plurality of bonding pads;

placing a semiconductor device over said tape;

electrically connecting said semiconductor device to said bonding pads;

forming an enclosure around said semiconductor device; and selectively attaching balls to ones of said contact pads so as to form a second contact pattern, said second contact pattern different from said first contact pattern as a result of configuration of said second contact pattern at a time subsequent from the time that said tape is formed such that the number of balls selectively attached to ones of said contact pads is less than the number of said contact pads.

\* \* \* \* \*